United States Patent
Azadet

(10) Patent No.: US 8,001,452 B2
(45) Date of Patent: Aug. 16, 2011

(54) METHODS AND APPARATUS FOR SOFT DECISION DECODING USING RELIABILITY VALUES BASED ON A LOG BASE TWO FUNCTION

(75) Inventor: Kameran Azadet, Morganville, NJ (US)

(73) Assignee: Agere Systems Inc., Allentown, PA (US)

( * ) Notice: Subject to any disclaimer, the term of this patent is extended or adjusted under 35 U.S.C. 154(b) by 1285 days.

(21) Appl. No.: 11/561,296

(22) Filed: Nov. 17, 2006

(65) Prior Publication Data

US 2008/0120531 A1     May 22, 2008

(51) Int. Cl.
*H03M 13/03*      (2006.01)
(52) U.S. Cl. .......... 714/794; 714/797; 714/803
(58) Field of Classification Search .......... 714/794, 714/781, 797, 799, 801, 803, 806; 375/341, 375/148, 262, 267
See application file for complete search history.

(56) References Cited

U.S. PATENT DOCUMENTS

| | | | | |
|---|---|---|---|---|
| 6,751,770 B2 * | 6/2004 | Morelos-Zaragoza | ....... | 714/781 |
| 7,221,720 B2 * | 5/2007 | Robinson | .............. | 375/341 |
| 7,372,896 B2 * | 5/2008 | Bjerke et al. | .............. | 375/148 |
| 7,676,734 B2 * | 3/2010 | Yamagishi | .............. | 714/780 |
| 2002/0131515 A1 * | 9/2002 | Rodriguez | .............. | 375/262 |
| 2005/0157811 A1 * | 7/2005 | Bjerke et al. | .............. | 375/267 |
| 2006/0078075 A1 * | 4/2006 | Stamoulis et al. | ........... | 375/346 |
| 2007/0094568 A1 * | 4/2007 | Choi et al. | .............. | 714/758 |
| 2007/0116143 A1 * | 5/2007 | Bjerke et al. | .............. | 375/262 |

OTHER PUBLICATIONS

A. J. Blanksby and C. J. Howland, "A 690-mW 1-Gb/s 1024-b, Rate-1/2 Low-Density Parity-Check Decoder," IEEE J. Solid-State Circuits, vol. 37, 404-412 (Mar. 2002).

* cited by examiner

*Primary Examiner* — Fritz Alphonse
(74) *Attorney, Agent, or Firm* — Ryan, Mason & Lewis, LLP

(57) ABSTRACT

Methods and apparatus are provided for soft decision decoding using reliability values based on a log base two function. A signal is processed to determine one or more reliability values for a soft decision decoder by computing one or more log-likelihood ratio (LLR) values using a log base two function. The soft decision decoder may employ, for example, a belief propagation algorithm. The soft decision decoder can decode, for example, Low-Density Parity Check codes or turbo codes.

21 Claims, 4 Drawing Sheets

METHODS AND APPARATUS FOR SOFT DECISION DECODING USING RELIABILITY VALUES BASED ON A LOG BASE TWO FUNCTION

FIELD OF THE INVENTION

The present invention relates generally to coding and decoding techniques, and more particularly to decoder algorithms for use in decoding encoded signals.

BACKGROUND OF THE INVENTION

Errors can occur when information is transmitted between a transmitter and a receiver. Error correction codes, such as Low Density Parity Check (LDPC) codes, are often used to detect and correct such errors. LDPC codes are block codes based on a parity check matrix, H. See, for example, R. G. Gallager, "Low-Density Parity-Check Code," IRE Trans. Inform. Theory, vol. IT-8, 21-28 (January 1962). LDPC codes are useful in high speed data transmission systems, for example, over a medium or carrier or via electromagnetic radiation, such as satellite communications, wireless transmissions, fiber optics, electrical wiring or cable and a variety of storage media, including hard disk drives, optical disks, and magnetic bands.

A given LDPC code is defined by a parity check matrix, H. A non-zero entry of the parity check matrix defines a parity check used to detect and correct errors in the received codeword. An LDPC parity check matrix is said to be sparse. In other words, there are a small number of non-zero entries in the matrix relative to the size of the matrix. If the parity check matrix, H, has dimension (n–k, n), a codeword is said to be n bits long with k information bits and n–k parity check bits. A parity check matrix for an (n, k) code has n columns and n–k rows.

Typically, a soft decision decoder for decoding LDPC codes and other turbo codes compute reliability values based on log likelihood ratios (LLRs). Typically, these reliability values require natural log or exponential computations. It has been found, however, that natural log( ) and exp( ) are inconvenient to implement with binary numbers. A need therefore exists for a soft decision decoder with reduced computational complexity.

SUMMARY OF THE INVENTION

Generally, methods and apparatus are disclosed for soft decision decoding using reliability values based on a log base two function. According to one aspect of the invention, a signal is processed to determine one or more reliability values for a soft decision decoder by computing one or more log-likelihood ratio (LLR) values using a log base two function. The soft decision decoder may employ, for example, a belief propagation algorithm. The soft decision decoder can decode, for example, Low-Density Parity Check codes or turbo codes.

The log base two function can comprise, for example:

$$\mathrm{Log}_2\left(\frac{2^{|x|}-1}{2^{|x|}+1}\right)$$

where the value x is an LLR of a check or variable node. According to further aspects of the invention, the log base two function may be estimated for values of x that satisfy predefined thresholds. Additional estimates can be obtained when x is expressed as a binary floating point representation equal to $\mu \cdot 2^\in$, where $\mu$ is a fractional part of the floating point representation, and $\in$ is an integer.

A more complete understanding of the present invention, as well as further features and advantages of the present invention, will be obtained by reference to the following detailed description and drawings.

DETAILED DESCRIPTION

The present invention provides methods and apparatus for LDPC decoding based on $\mathrm{Log}_2$ and power of two arithmetic representations of reliability messages. While the present invention is illustrated in the context of exemplary low-density parity check codes, the present invention can be applied to any soft decision decoder that determines reliability values based on log-likelihood ratio (LLR) values, as would be apparent to a person of ordinary skill in the art. Among other benefits, the present invention allows such codes to be more reliably decoded, for example, in the presence of noise or other channel impairments.

Low-Density Parity Check Codes

The following background discussion of LDPC codes and LDPC decoding is based on a discussion in, A. J. Blanksby and C. J. Howland, "A 690-mW 1-Gb/s 1024-b, Rate-½ Low-Density Parity-Check Decoder," IEEE J. Solid-State Circuits, Vol. 37, 404-412 (March 2002), incorporated by reference herein. For a more detailed discussion, the reader is referred to the full Blanksby and Howland paper.

Matrix Representation of LDPC Codes

LDPC codes are lineal block codes. The set of all codewords, $x \in C_x$, spans the null space of a parity check matrix H:

$$Hx^T = 0, \forall x \in C_x. \quad (1)$$

The parity check matrix for LDPC codes is a sparse binary matrix.

Figure 1:
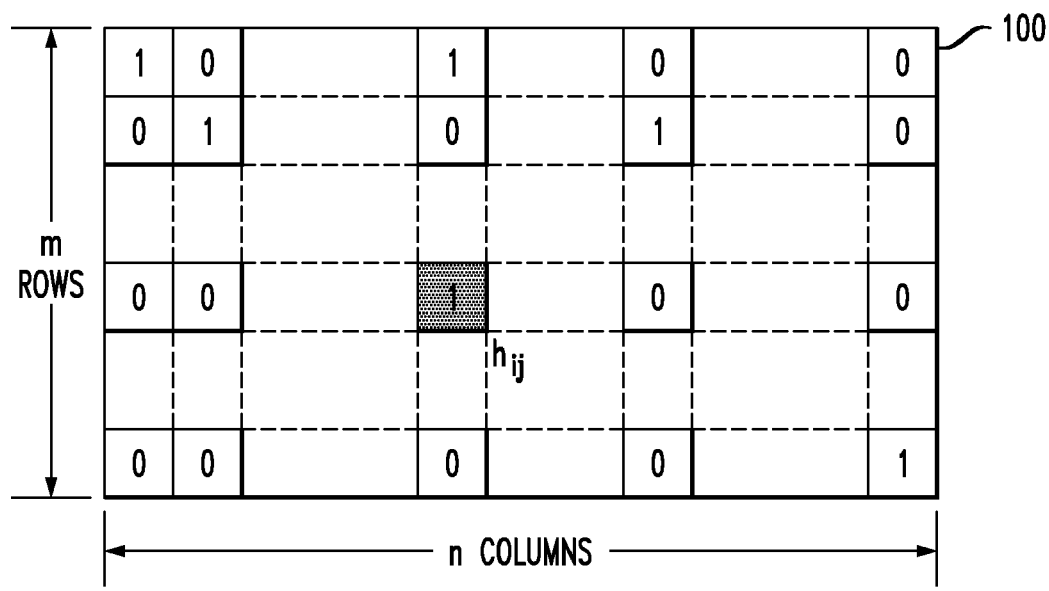
FIG. 1 illustrates the general structure of an LDPC matrix, H.

FIG. 1 illustrates the general structure 100 of an LDPC matrix, H. As shown in FIG. 1, each row of the parity check matrix, H, corresponds to a parity check and a set element $h_{ji}$ indicates that data bit i participates in parity check j. In a block of n bits, there are m redundant parity bits. The code rate is given by:

$$r = (n-m)/n \quad (2)$$

The set row and column elements of the parity check matrix H are selected to satisfy a desired row and column weight profile, where the row and column weights are defined as the number of set elements in a given row and column, respectively. In a regular LDPC code, all rows are of uniform weight, as are all columns. If the rows and columns are not of uniform weight, the LDPC code is said to be irregular.

Graph Representation of LDPC Codes

Figure 2:
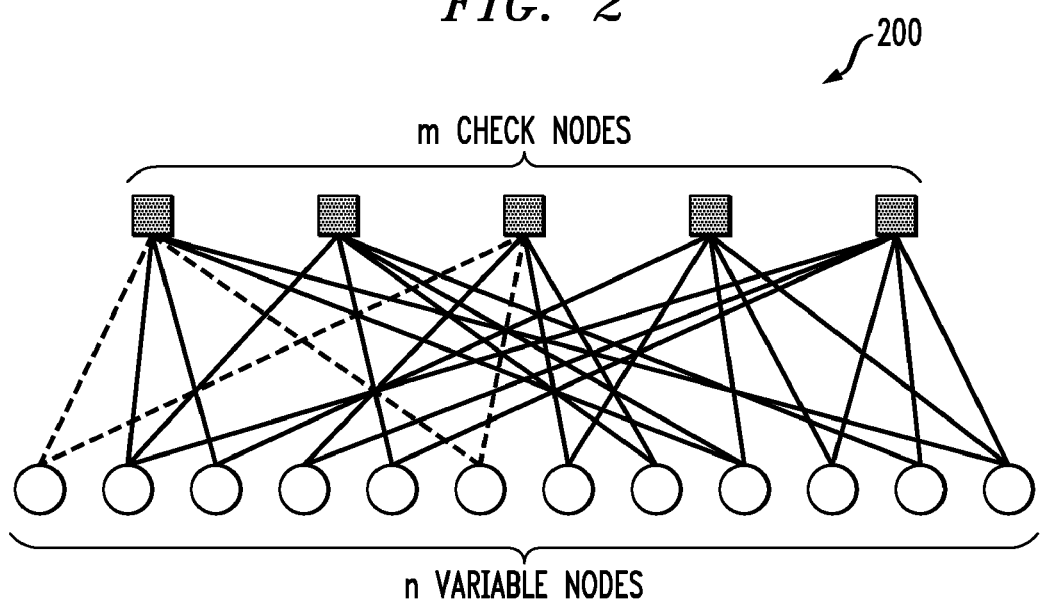
FIG. 2 is an exemplary bipartite graph representation of an LDPC code.

LDPC codes can also be represented using a bipartite graph, where one set of nodes represents the parity check constraints and the other set represents the data bits. FIG. 2 is an exemplary bipartite graph representation 200 of an LDPC code. The parity check matrix is the incidence matrix of the graph where a bit node i, corresponding to column i in H, is connected to check node j, corresponding to row j in H, if the entry $h_{ji}$ in H is set, i e., non-zero.

The algorithm used for decoding LDPC codes is known as the sum-product algorithm. For good decoding performance with this algorithm, it is important that the length of cycles in the graph representation of the LDPC code is as long as possible. In the exemplary representation of FIG. 2, an exemplary short cycle of length four has been illustrated. Short cycles, such as the length-4 cycle illustrated in FIG. 2, degrade the performance of the sum-product algorithm.

Belief Propagation Algorithm

The sum-product algorithm is an iterative algorithm for decoding LDPC codes. The sum-product algorithm is also known as the message passing algorithm or belief propagation algorithm. For a more detailed discussion of the sum-product algorithm, see, for example, A. J. Blanksby and C. J. Howland, "A 690-mW 1-Gb/s 1024-b, Rate-½ Low-Density Parity-Check Decoder," IEEE J. Solid-State Circuits, Vol. 37, 404-412 (March 2002), and D. E Hocevar, "LDPC Code Construction With Flexible Hardware Implementation," IEEE Int'l Conf. on Comm (ICC), Anchorage, Ak., 2708-2712 (May, 2003), each incorporated by reference herein.

The reliability message from bit (or variable) node i to check node j is given by:

$$Q_{i,j} = \sum_{l \in B_i, l \neq j} R_{l,i} + \lambda_i \qquad (3)$$

It is noted that the notations used herein are defined in a table at the end of the specification. The reliability message from check node j to bit (or variable) node i is given by:

$$R_{j,i} = s_{j,i'} F(x) \left( \sum_{l \in C_j, l \neq i} F(x)(|Q_{l,j}|) \right) \qquad (4)$$

where:

$$s_{j,i} = \prod_{l \in C_j, l \neq i} \text{sign}(Q_{l,j});$$

and $$F(x) = -\log\tanh(x/2) = \log\frac{e^x + 1}{e^x - 1}.$$

The a-posteriori information value, which is also called a-posteriori log-likelihood ratio (LLR), for bit i, $\Lambda_i$, is given by:

$$\Lambda_i = \sum_{l \in B_i} R_{l,i} + \lambda_i$$

Figure 3:
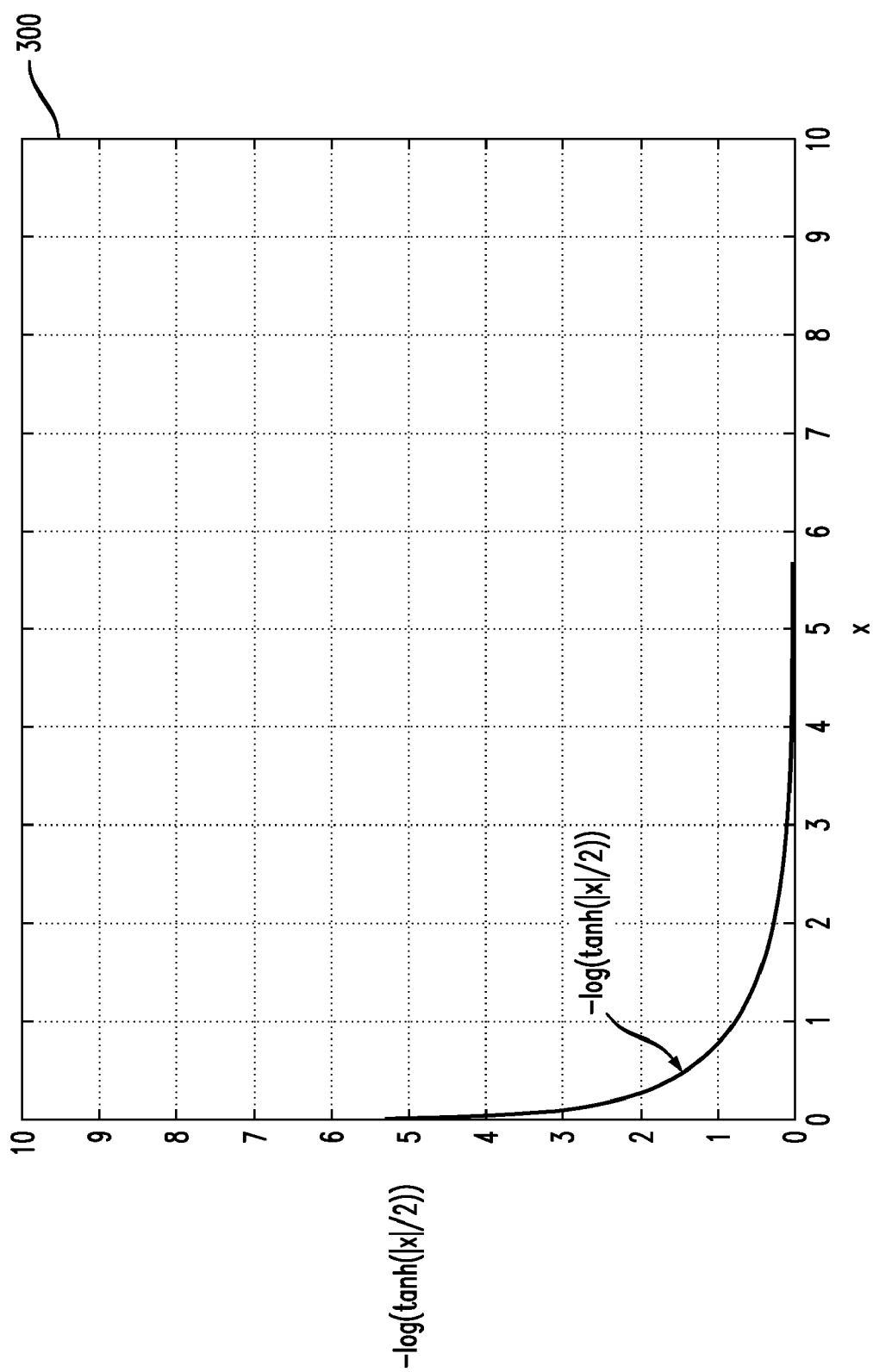
FIG. 3 illustrates the function, F(x), used by an exemplary belief propagation algorithm.

FIG. 3 illustrates the function, F(x) 300. As shown in FIG. 3, for small values of x, the function, F(x), is large, and vice versa. It is known that the function, F(x), is its own inverse. In addition, for large values of x, such as x>>0.85, the function, F(x), can be estimated as 2 exp(-x), Likewise, for small values of x, such as x<<0.85, the function, F(x), can be estimated as -Log(x)+Log(2). Such approximations for large or small values of x can help solve numerical problems. In practice, the function, F(x), can be implemented using a look up table (LUT).

It is also seen from FIG. 3, that the function, F(x), has a very wide dynamic range. A floating point representation of the LLRs can represent a wide dynamic range, even when using a low resolution. For example, a 1 bit floating point representation for 32 bit accuracy indicates the position of the bit across the 32 bits. The position can be anywhere from 0-31 and thus can be represented with only 5 bits. The present invention recognizes that natural log( ) and exp( ) are inconvenient to implement with binary numbers. As discussed hereinafter, one aspect of the present invention changes the LLR definition using a new log base 2 definition of LLR. In addition, in a further variation, the lookup tables can be eliminated if the LLRs are represented as exact powers of two.

LLRs Using Log Base 2

According to one aspect of the present invention, the log likelihood definition can be changed to log base 2, as follows:

$$L_2(x) = \frac{p(x=0)}{p(x=1)},$$

or in Log domain:

$$LLR_2(x) = \text{Log}_2\left(\frac{p(x=0)}{p(x=1)}\right)$$

Thus, for a variable x with Gaussian distribution and standard deviation σ the incoming LLR can be expressed as follows:

$$LLR_2(x) = \text{Log}_2\left(\frac{e^{-\frac{(x+1)^2}{\sigma^2}}}{e^{-\frac{(x-1)^2}{\sigma^2}}}\right) = -\frac{2x}{\sigma^2}\text{Log}_2(e)$$

Derivation

Assume for simplicity that a check node is expressed as follows:

$$c = x_1 \oplus x_2$$

Thus, the check probability can be expressed as:

$$p(c=0) = p(x_1=0)p(x_2=0) + p(x_1=1)p(x_2=1)$$

$$2p(c=0) - 1 = (2p(x_1=0) - 1)(2p(x_2=0) - 1)$$

If the above probabilities are replaced by LLRs, the expression becomes:

$$p(x=0) = \frac{L_2(x)}{1 + L_2(x)} = \frac{2^{LLR_x(x)}}{1 + 2^{LLR_x(x)}}$$

Thus, $$2\frac{2^{LLR_x(c)}}{1 + 2^{LLR_x(c)}} - 1 = \left(2\frac{2^{LLR_x(x_0)}}{1 + 2^{LLR_x(x_0)}} - 1\right)\left(2\frac{2^{LLR_x(x_1)}}{1 + 2^{LLR_x(x_1)}} - 1\right)$$

If the Log2 is taken of both sides, then:

$$F_2(LLR_2(c)) = F_2(LLR_2(x_0)) + F_2(LLR_2(x_1))$$

Thus, a new base 2 function incorporating features of the present invention is defined as:

$$F_2(x) = \text{Log}_2\left(\frac{2^{|x|} - 1}{2^{|x|} + 1}\right) \tag{5}$$

Figure 4:
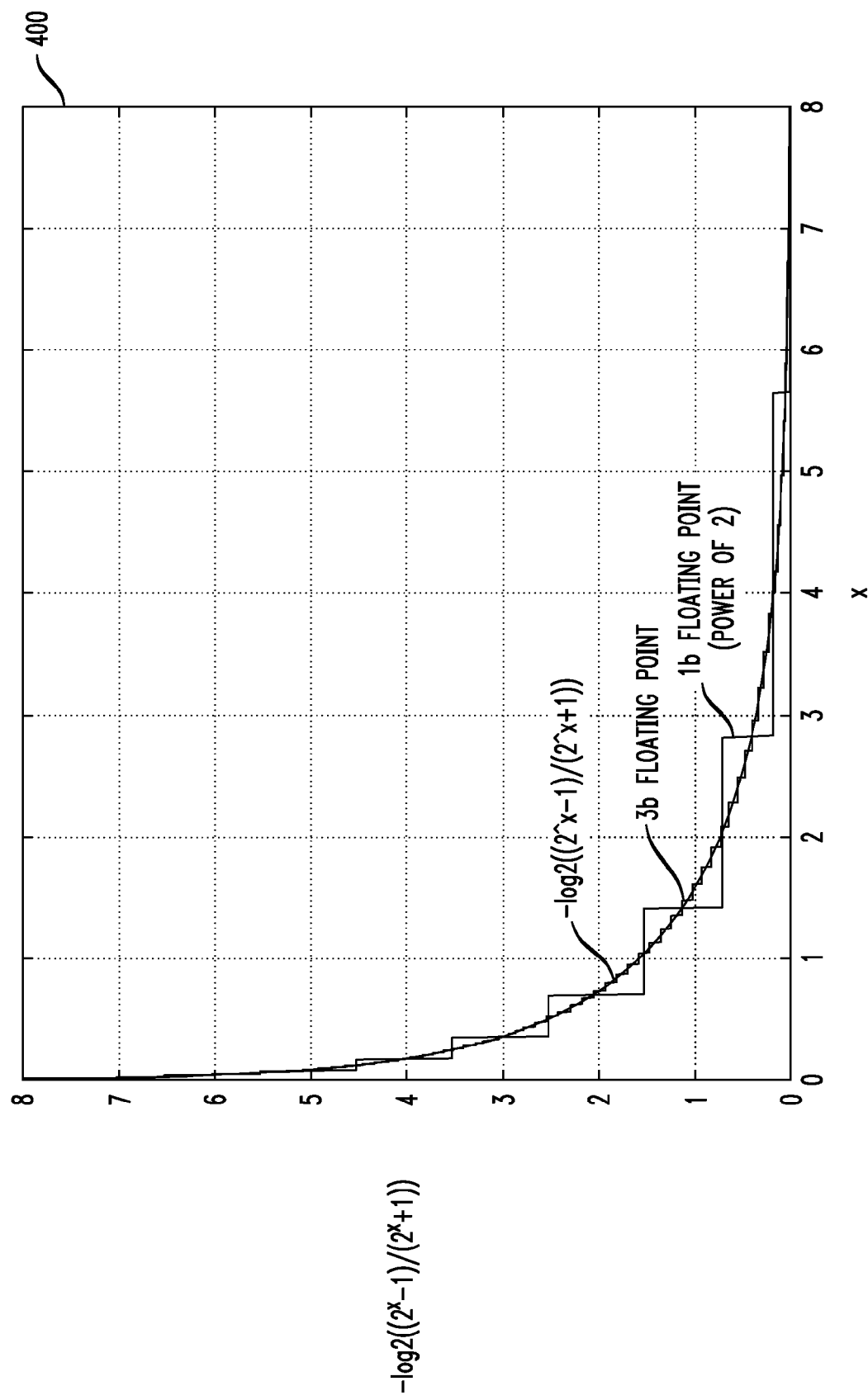
FIG. 4 illustrates the function, $F_2(x)$, incorporating features of the present invention.

FIG. 4 illustrates the function, $F_2(x)$ 400 incorporating features of the present invention. As shown in FIG. 4, for small values of x, the function, $F_2(x)$, is large, and vice versa, in a similar manner to the function of FIG. 3.

Thus, for small values of x (x>0), such as values of x much less than 1, equation (5) can be expressed as follows:

$$F_2(x) = \text{Log}_2\left(\frac{2^x - 1}{2^x + 1}\right) \approx -\text{Log}_2(2^x - 1) + 1 \tag{6}$$

If the Taylor series is employed:

$$2^x = 1 + x \cdot \text{Log}(2) + \frac{1}{2}(x \cdot \text{Log}(2))^2 + \ldots$$

Finally, for small values of x (x>0), such as values of x much less than 1, equation (5) can thus be expressed as follows:

$$F_2(x) \approx -\text{Log}_2(x) + 1 - \text{Log}_2(\text{Log}(2)), \text{ for } x << 1 \tag{7}$$

Equation (7) is comprised of a $\log_2(x)$ function and a constant. Thus, equation (7) can be implemented without a lookup table.

Likewise, for large values of x (x>0), such as values of x much greater than 1, equation (5) can be expressed as follows:

$$F_2(x) = \text{Log}_2\left(\frac{1 - 2^{-x}}{1 + 2^{-x}}\right) \approx -\text{Log}_2(1 - 2^{-x}) \tag{8}$$

or $$F_2(x) \approx 2\left(\frac{2^{-x}}{\text{Log}(2)}\right), \text{ for } x >> 1 \tag{9}$$

The numerator of Equation (9) is a power of two operation and the remainder of the equation is a constant. Thus, equation (9) can be implemented without a lookup table.

Base 2 Floating Point Representation

According to a further aspect of the present invention, a base two floating point representation is employed. A floating point representation of x can be expressed as:

$$x = \mu \cdot 2^\in$$

where $\mu$ is the fractional part, and $\in$ is an integer.

Thus, equations (7) and (9) for F2(x) small and large values, respectively become:

$$F_2(x) \approx -\in -\text{Log}_2(\mu) + 1 - \text{Log}_2(\text{Log}(2)), \text{ for } x << 1 \tag{10}$$

$$F_2(x) \approx 2\left(\frac{2^{-\mu 2^\in}}{\text{Log}(2)}\right), \text{ for } x >> 1 \tag{11}$$

Equations (10) and (11) can be implemented with only the values of $\mu$ and $\in$ as inputs.

In equation (10), the term $1 - \text{Log}_2(\text{Log}(2))$ is a simple additive constant number that can be precomputed. $\text{Log}_2(\mu)$ requires computation of a $\text{Log}_2$ function which can be done with a very small table look-up if the term $\mu$ has a coarse resolution (for example, 3 bits would result in a table look-up with 8 entries)

In equation (11), the quantity $2/\text{Log}(2)$ (a known and fixed number which can be pre-computed) is multiplied by a power of 2. This multiplication operation is actually a simple shift operation since it involves a power of 2.

For the special case where $\mu$ is equal to one, referred to as power of two, x can be represented as:

$$x = 2^\in$$

and equations (10) and (11) become:

$$F_2(x) \approx -\in + 1 - \text{Log}_2(\text{Log}(2)), \text{ for } x << 1 \tag{12}$$

$$F_2(x) \approx 2\left(\frac{2^{-2^\in}}{\text{Log}(2)}\right), \text{ for } x >> 1 \tag{13}$$

Equation (12) is easily computed as the inverse of $\in$ plus a pre-computed constant $(+1 - \text{Log}_2(\text{Log}(2)))$. Likewise, equation (13) is easily computed as a pre-computed constant $(2/\log(2))$ multiplied (i.e., shifted) by a power of two.

The disclosed Log base 2 definition of LLRs simplifies the math in LDPC decoders to Log base 2 or power of two operations. According to a further aspect of the invention, power of 2 floating point representations can be used for reliability messages between variable and check nodes and fixed or floating point additions.

In one exemplary implementation, a power of two (1 bit floating point) representation of the reliability messages is used (where the bit position is defined by an m bit number; for K=4, the 1 bit data position can be anywhere from LSB to MSB of a 16 bit word).

It has been found that even a coarse floating point representation, such as 1 bit, better captures a function with wide dynamic range than the conventional fixed point arithmetic.

According to yet another aspect of the invention, disclosed definitions of F(x) for large and small values of x avoid the use of look up tables.

Figure 5:
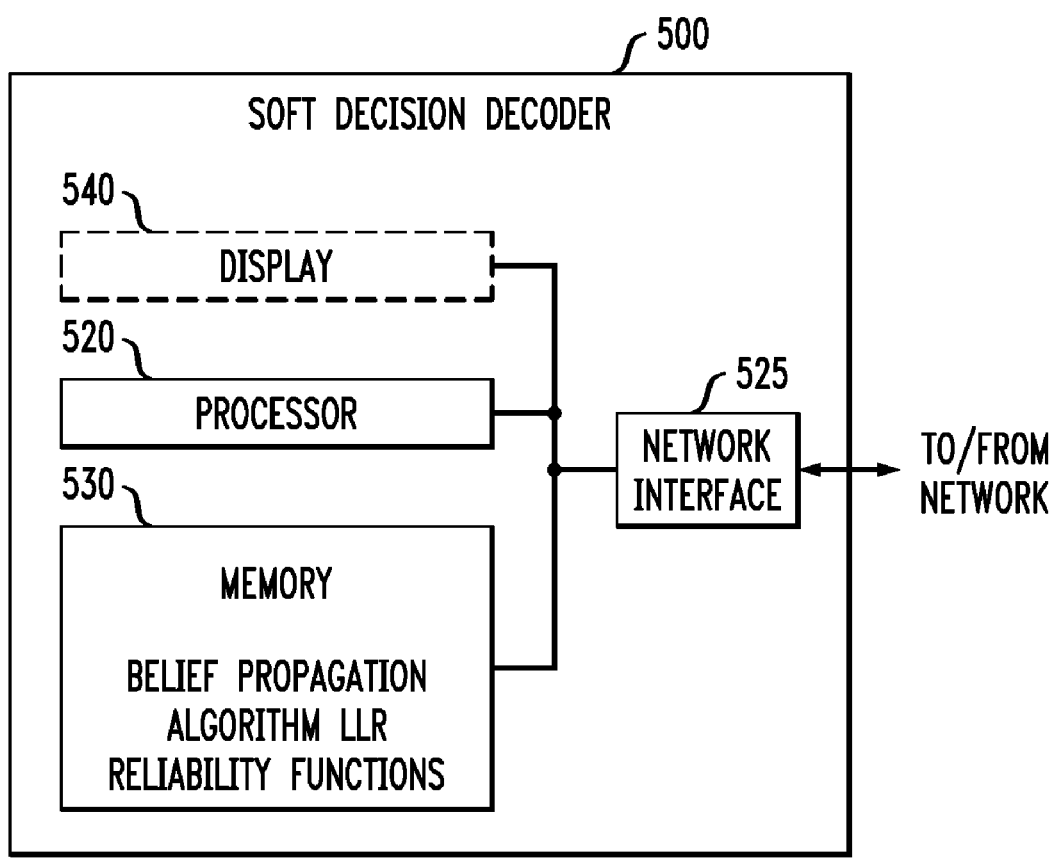
FIG. 5 is a schematic block diagram of a soft decision decoder 600 in accordance with the present invention.

FIG. 5 is a schematic block diagram of a soft decision decoder 500 in accordance with the present invention. The soft decision decoder 500 may optionally be implemented as a computer system. The exemplary soft decision decoder 500 comprises a processor 520, a network interface 525, a memory 530, and a display 540. Network interface 525 optionally allows the computer system to connect to a network. Optional display 540 is any type of display suitable for interacting with a human user of apparatus 500. Generally, display 540 is a computer monitor or other similar video display.

As shown in FIG. 5, the exemplary memory 530 includes the belief propagation algorithm and one or more LLR reliability functions ($F_2(x)$) incorporating features of the present invention.

Notation

The following notation has been used herein:

i is the index of a bit node;
j is the index of a check node;
k is the index of the iteration;
$Q_{ij}$ is the message from bit node i to check node j,
$R_{ji}$ is the message from check node j to bit node i,
$\lambda_i$ is the a-priori information value or a-priori log-likelihood ratio (LLR) pertaining to bit i;
$\Lambda_i$ is the a-posteriori information value of a-posteriori LLR pertaining to bit i;
$\Lambda_{ext,i}$ is the extrinsic information value or extrinsic LLR pertaining to bit i;
$B_i$ is the set of check nodes connected to bit node i,
$C_j$ is the set of bit nodes connected to check node j;
n is the number of bit nodes;
m is the number of parity check nodes;
$d_r$ is the row weight of the parity check matrix;
$d_c$ is the column weight of the parity check matrix;
bit nodes are 1 ... n;
check nodes are 1 ... m.

As would be apparent to one skilled in the art, various functions may be implemented in the digital domain as processing steps in a software program, in hardware by circuit elements or state machines, or in combination of both software and hardware. Any equation can be implemented in digital logic. The form of the equation may determine the structure of the digital logic used. Such software may be employed in, for example, a digital signal processor, microprocessor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a digital signal processor, microprocessor, micro-controller, or a general-purpose computer, the program code segments combine with the processor to provide a device that operates analogously to specific logic circuits.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e g., floppy disks, hard drives, compact disks, memory cards, semiconductor devices, chips, application specific integrated circuits (ASICs)) or may be a transmission medium (e g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The memories and buffers could be distributed or local and the processors could be distributed or singular. The memories and buffers could be implemented as an electrical, magnetic or optical memory, or any combination of these or other types of storage devices. Moreover, the terms "memory," "buffer" and "FIFO buffer" should be construed broadly enough to encompass any information able to be read from or written to a medium. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for processing a signal to determine one or more reliability values for a soft decision decoder, comprising the step of:

computing on one or more of a processor and an application-specific circuit one or more log-likelihood ratio (LLR) values for decoding said signal using a log base two function, wherein said LLR values are not based on a natural log function; and providing said one or more LLR values to said soft decision decoder.

2. The method of claim 1, wherein said soft decision decoder employs a belief propagation algorithm.

3. The method of claim 1, wherein said soft decision decoder decodes one or more Low-Density Parity Check codes.

4. The method of claim 1, wherein said soft decision decoder decodes one or more turbo codes.

5. The method of claim 1, wherein said log base two function comprises:

$$\text{Log}_2\left(\frac{2^{|x|}-1}{2^{|x|}+1}\right)$$

where said value x is an LLR of a check or variable node.

6. The method of claim 1, wherein said log base two function may be estimated as:

$$-\text{Log}_2(x)+1-\text{Log}_2(\text{Log}(2))$$

for values of x below a predefined threshold.

7. The method of claim 1, wherein said log base two function may be estimated as:

$$2\left(\frac{2^{-x}}{\text{Log}(2)}\right)$$

for values of x above a predefined threshold.

8. The method of claim 1, wherein said log base two function may be estimated as:

$$-\in-\text{Log}_2(\mu)+1-\text{Log}_2(\text{Log}(2))$$

for values of x below a predefined threshold expressed as a binary floating point representation equal to $\mu \cdot 2^\in$, where $\mu$ is a fractional part of the floating point representation, and $\in$ is an integer.

9. The method of claim 1, wherein said log base two function may be estimated as:

$$2\left(\frac{2^{-\mu 2^{\mathcal{E}}}}{\text{Log}(2)}\right)$$

for values of x above a predefined threshold expressed as a binary floating point representation equal to $\mu \cdot 2^{\mathcal{E}}$, where $\mu$ is a fractional part of the floating point representation, and $\mathcal{E}$ is an integer.

10. The method of claim 1, wherein said log base two function may be estimated as:

$$-\mathcal{E}+1-\text{Log}_2(\text{Log}(2))$$

for values of x below a predefined threshold expressed as a binary floating point representation equal to $\mu \cdot 2^{\mathcal{E}}$, where $\mu$ is a fractional part of the floating point representation equal to one, and $\mathcal{E}$ is an integer.

11. The method of claim 1, wherein said log base two function may be estimated as:

$$2\left(\frac{2^{-2^{\mathcal{E}}}}{\text{Log}(2)}\right)$$

for values of x above a predefined threshold expressed as a binary floating point representation equal to $\mu \cdot 2^{\mathcal{E}}$, where $\mu$ is a fractional part of the floating point representation equal to one, and $\mathcal{E}$ is an integer.

12. An apparatus for processing a signal to determine one or more reliability values for a soft decision decoder, the apparatus comprising:
a memory; and
at least one processor, coupled to the memory, operative to:
compute one or more log-likelihood ratio (LLR) values for decoding said signal using a log base two function, wherein said LLR values are not based on a natural log function.

13. The apparatus of claim 12, wherein said soft decision decoder employs a belief propagation algorithm.

14. The apparatus of claim 12, wherein said soft decision decoder decodes one or more of Low-Density Parity Check codes and turbo codes.

15. The apparatus of claim 12 wherein said log base two function comprises:

$$\text{Log}_2\left(\frac{2^{|x|}-1}{2^{|x|}+1}\right)$$

where said value x is an LLR of a check or variable node.

16. The apparatus of claim 12, wherein said log base two function may be estimated for values of x that satisfy a predefined threshold.

17. The apparatus of claim 12, wherein said log base two function may be estimated for values of x that satisfy a predefined threshold expressed as a binary floating point representation equal to $\mu \cdot 2^{\mathcal{E}}$, where $\mu$ is a fractional part of the floating point representation, and $\mathcal{E}$ is an integer.

18. The apparatus of claim 12, wherein said log base two function may be estimated for values of x that satisfy a predefined threshold expressed as a binary floating point representation equal to $\mu \cdot 2^{\mathcal{E}}$, where $\mu$ is a fractional part of the floating point representation equal to one, and $\mathcal{E}$ is an integer.

19. The apparatus of claim 12, wherein the soft decision decoder is implemented in one of an integrated circuit, a digital signal processor, a microprocessor, a micro-controller, and a general-purpose computer.

20. An article of manufacture for processing a signal to determine one or more reliability values for a soft decision decoder, comprising a tangible machine readable recordable medium containing one or more programs which when executed implement the steps of:
computing one or more log-likelihood ratio (LLR) values for decoding said signal using a log base two function, wherein said LLR values are not based on a natural log function.

21. The article of manufacture of claim 20, wherein said soft decision decoder employs a belief propagation algorithm.

* * * * *